United States Patent [19]
Taguchi

[11] Patent Number: 6,157,079
[45] Date of Patent: Dec. 5, 2000

[54] SEMICONDUCTOR DEVICE WITH A BUMP INCLUDING A BUMP ELECTRODE FILM COVERING A PROJECTING PHOTORESIST

[75] Inventor: Noboru Taguchi, Tokorozawa, Japan

[73] Assignee: Citizen Watch Co., LTD, Tokyo, Japan

[21] Appl. No.: 09/188,718

[22] Filed: Nov. 10, 1998

[30] Foreign Application Priority Data

Nov. 10, 1997 [JP] Japan ................................ 9-306958

[51] Int. Cl.⁷ .......................... H01L 23/48; H01L 23/52; H01L 29/40
[52] U.S. Cl. .......................... 257/737; 257/738; 257/780
[58] Field of Search .................... 257/737, 738, 257/780, 784; 438/613

[56] References Cited

U.S. PATENT DOCUMENTS

| | | | |
|---|---|---|---|
| 3,585,461 | 6/1971 | Eynon et al. | 317/234 |
| 4,042,954 | 8/1977 | Harris | 29/589 |
| 4,922,322 | 5/1990 | Mathew | 257/737 |
| 5,046,161 | 9/1991 | Takada | 257/778 |
| 5,134,460 | 7/1992 | Brady et al. | 257/737 |
| 5,272,111 | 12/1993 | Kosaki | 438/614 |
| 5,478,973 | 12/1995 | Yoon et al. | 174/260 |
| 5,925,931 | 7/1999 | Yamamoto | 257/737 |
| 5,943,597 | 8/1999 | Kleffner et al. | 438/613 |

FOREIGN PATENT DOCUMENTS 2-139933  5/1990  Japan .................................. 257/737

*Primary Examiner*—Olik Chaudhuri
*Assistant Examiner*—Phat X. Cao
*Attorney, Agent, or Firm*—Armstrong, Westerman, Hattori, McLeland & Naughton

[57] ABSTRACT

On a semiconductor substrate provided with an integrated circuit and electrode pads, an insulating film is formed to have an opening portion so as to cover the edge of each electrode pad and to expose the inside thereof. A projecting photoresist is formed to leave a partially exposed portion not covered above the electrode pad. A bump electrode film connecting to the exposed portion of the electrode pad is formed on the surface of the projecting photoresist with an electroless plating or sputtering. Thus, a semiconductor device for surface mounting is formed.

5 Claims, 8 Drawing Sheets

SEMICONDUCTOR DEVICE WITH A BUMP INCLUDING A BUMP ELECTRODE FILM COVERING A PROJECTING PHOTORESIST

BACKGROUND OF THE INVENTION

1. Field of the Invention

The present invention relates to a semiconductor device, more particularly, to a semiconductor device having bump(s) (projecting electrode(s) for connection) for electrical and mechanical connection to a wiring pattern of a circuit board when mounted on the circuit board and a method of fabricating the same.

2. Description of the Related Art

Semiconductor devices of the surface-mounting type are increasingly used as a semiconductor device constituting an integrated circuit (IC) or a large scale integrated (LSI) circuit.

Some semiconductor devices of surface-mounting type have multiple bumps provided on the surfaces thereof for electrical and mechanical connection to a wiring pattern of a circuit board when mounted on the circuit board. As an example, the configuration of a bump in a straight wall shape is shown in FIG. 20.

FIG. 20 is a sectional view showing a portion of a conventional semiconductor device. On a semiconductor substrate 12 having an integrated circuit formed therein, multiple electrode pads 14 (only one is shown in FIG. 20) are provided for connection to an external circuit. An insulating film 16 having opening portions 16a each formed to cover the edge of each electrode pad 14 and to expose the inside portion thereof is provided on the entire surface of the semiconductor substrate 12. A lower electrode 19 is provided to be closely contacted with the periphery of the opening portion 16a of the insulating film 16 and the exposed portion of the electrode pad 14.

Additionally, provided on the lower electrode 19, there is a bump 36 formed in a straight wall shape.

In this semiconductor device, the bump electrode 36 is formed in a straight wall shape. In contrast, some semiconductor devices have bumps each formed in a mushroom shape in which the upper portion is larger than the base portion. However, a straight wall shape bump can have a less extended area in the lateral direction along the semiconductor substrate 12 to allow more bumps to be arranged at an increased density, thereby obtaining a finer pitch for connection to an external circuit.

Next, as an example of mounting a semiconductor device having the bump 36 formed as described above onto a circuit board, a structure for mounting on a glass substrate of a liquid crystal display panel is shown in FIG. 21.

The liquid crystal display panel is designated with reference numeral 40, in which a liquid crystal 43 is filled in between two glass substrates 41, 42 by a sealing material 44, and an area 8 corresponding to an extended portion of the lower glass substrate 42 with regard to the upper glass substrate 41 is an area for mounting a semiconductor device 10 which drives the liquid crystal display panel 40.

On the upper surface of the glass substrate 42, multiple wiring patterns 45 extending from the inside where the liquid crystal is filled toward the area 8 and multiple wiring patterns 46 serving as a connection terminal to the outside are formed.

To mount the semiconductor device 10 on the liquid crystal display panel 40, first, an anisotropic conductive adhesive 50 obtained by mixing conductive particles 52 into an insulating adhesive is applied on the area 8 of the glass substrate 42. Next, the semiconductor device 10 is disposed above the area 8 of the glass substrate 42 in alignment with the wiring patterns 45, 46 for connection to each bump 36, in an orientation upside down with respect to that of the semiconductor device 10 shown in FIG. 20.

In this way, with the semiconductor device 10 set on the substrate 42 applied with the anisotropic conductive adhesive 50, the semiconductor device 10 is pressed on the glass substrate 42 and is subjected to an annealing treatment so that each bump 36 is electrically connected to the wiring patterns 45, 46 through the conductive particles 52 in the anisotropic conductive adhesive 50. Simultaneously, the semiconductor device 10 is attached and fixed to the glass substrate 42 with the insulating adhesive in the anisotropic conductive adhesive 50.

Also, a flexible printed circuit (FPC) board 60 is disposed at its end portion above the portion of the glass substrate 42 that is formed with the wiring pattern 46. This FPC 60 is formed with a wiring pattern made of copper foil for providing an input signal to the semiconductor device 10.

This wiring pattern is also electrically connected to the wiring pattern 46 on the glass substrate 42 through the conductive particles 52 in the anisotropic conductive adhesive 50 and the end portion of the FPC is attached and fixed to the glass substrate 42.

Such a configuration ensures connections by the conductive particles 52 in the anisotropic conductive adhesive 50 between the bump 36 and the wiring pattern 45 on the glass substrate 42 as well as between the wiring pattern of the FPC 60 and the wiring pattern 46 on the glass substrate 42, respectively, thereby forming respective electrical connections. Mechanical connections are also formed by the insulating adhesive.

Thereafter, a mold resin 62 is applied on the upper surface of the connections for the semiconductor 10 and the FPC 60 and the surrounding regions thereof. This prevents moisture from entering the connections of the bump 36 and the wiring pattern 45 and the connections of the FPC 60 and the wiring pattern 46, and can provide mechanical protection to enhance reliability.

It is a matter of course that the semiconductor device having the bump as described above can be mounted not only on a liquid crystal display panel but also on various circuit boards in which a wiring pattern is formed on a resin substrate, ceramic substrate, and so on.

Next, the method of fabricating the conventional semiconductor device having a bump in a straight wall shape will be described using sectional views in FIG. 17 to FIG. 20.

First, as shown in FIG. 17, on the semiconductor substrate 12 having multiple electrodes pads 14 formed on the upper surface, the insulating film 16 is formed to cover the entire surface thereof. The opening portion 16a is formed by a photoetching technique on each electrode pad 14 such that the insulating film 16 is left only on the edge of each electrode pad 14 to expose the inside portion thereof.

Next, a common electrode film 32 is formed above the entire surface of the semiconductor substrate 12 having the electrode pad 14 and the insulating film 16 by a sputtering.

The common electrode film 32 is obtained by sequentially forming aluminum in the thickness of 0.8 $\mu$m, chromium at 0.01 $\mu$m, and copper at 0.8 $\mu$m from the side of the semiconductor substrate 12 to make a three-layered structure. The common electrode film 32 serves both as a barrier layer for connecting to the electrode pad 14 and for preventing interdiffusion to the electrode pad 14, and as an electrode for forming the bump by an electroplating.

Thereafter, a photoresist (photoresistive resin) 18 shown in FIG. 18 is formed on the entire surface of the common electrode film 32 by a spin coating. An opening portion 18a is then formed in the portion in which the bump is to be formed by a photolithography technique.

As shown in FIG. 19, gold plating is plated onto the common electrode 32 in the opening portion 18a of the photoresist 18 to thereby form the bump 36 in a straight wall shape in a thickness ranging from 10 to 15 μm.

After the photoresist 18 is removed, the bump 36 is used as a mask to etch the common electrode film 32 by a wet etching. Thus, as shown in FIG. 20, the common electrode film 32 is left only below the bump 36 to serve as the lower electrode 19.

After the above-mentioned steps, the semiconductor substrate 12 is cut into single pieces of a semiconductor chip in a dicing step to complete the semiconductor device.

However, the formation of the bump 36 through the above-mentioned steps has disadvantages in that the fabricating steps for the semiconductor device take a very long time and the steps require various apparatuses for forming films such as a sputtering apparatus, an etching apparatus, and an electroplating apparatus. Additionally, the above-mentioned steps have a disadvantage in that since the bump 36 must be formed in a thickness of 10 to 15 μm by the electroplating method, the plating takes a relatively long time of approximately 30 to 40 minutes.

Furthermore, there exists a disadvantage in that the long time required for plating causes fine particles existing in the plating solution to easily attach to the portion in which the bump is to be formed and the particles serve as a nucleus to generate abnormal plating growth, thereby resulting in a reduction in the yield.

Since the fabrication of the conventional semiconductor device requires the plating step for a thick film for forming the bump 36 and the step for removal by etching the major part of the common electrode film 32 formed on the entire surface to form the lower electrode 19, it takes a long time until completion and the yield of the semiconductor device is easily reduced. Thus, it has been very difficult to reduce the fabrication cost.

SUMMARY OF THE INVENTION

The present invention is made to solve the above-mentioned disadvantages and it is an object of the present invention to simplify the fabricating steps of a semiconductor device for surface mounting having bumps and to enhance the yield, thereby realizing a reduction in cost.

The present invention provides a semiconductor device and a method of fabricating the same as constituted in the following manner for achieving the above-mentioned object.

A semiconductor device according to the present invention comprises a semiconductor substrate provided with an integrated circuit and a plurality of electrode pads for connecting the integrated circuit to an external circuit; an insulating film formed above the semiconductor substrate and having an opening portion for covering an edge portion of each of the electrode pads and for exposing an inside portion thereof; a projecting photoresist formed to leave a partially exposed portion not covered above the electrode pad; and a bump electrode film for covering the projecting photoresist and for connecting to the electrode pad through the exposed portion.

The projecting photoresist may be formed above substantially the entire surface on the electrode pad and may have an opening portion formed of a hole or groove to provide the exposed portion in substantially the central portion of the electrode pad.

Alternatively, the projecting photoresist may be formed offset in some degree toward one side above the electrode pad to provide the exposed portion of the electrode pad near an edge of the opening portion of the insulating film.

The bump electrode film may be formed of a two-layer structure made of two kinds of metals including titanium, or may be formed of a three-layer structure made of three kinds of metals of aluminum, titanium, and gold.

A method of fabricating a semiconductor device according to the present invention comprises the following steps:

(1) forming, on a semiconductor substrate provided with an integrated circuit and a plurality of electrode pads for connecting the integrated circuit to an external circuit, an insulating film having an opening portion for covering an edge portion of each of the electrode pads and for exposing the inside portion thereof;

(2) forming a photoresist above the insulating film and above the entire surface on the electrode pad exposed in the opening portion of the insulating film;

(3) forming a projecting photoresist by patterning the photoresist to leave the photoresist above the electrode pad and to form an opening portion for providing an exposed portion in a portion of the electrode pad; and (4) forming a projecting electrode film connecting to the exposed portion of the electrode pad by selectively performing an electroless plating on a surface of the photoresist including the inside of the opening portion.

In the method of fabricating the semiconductor device, a step of selectively roughening a surface of the projecting photoresist may be provided after a step (3) of forming the projecting photoresist.

The step may use a dry etching or a wet etching.

In the step of forming the projecting photoresist, baking may be performed at a temperature of approximately 350° C. for approximately 30 minutes in a nitrogen atmosphere after patterning the photoresist.

The method of fabricating a semiconductor device may use the following respective steps instead of the above-mentioned steps (3) and (4):

(5) forming a projecting photoresist by patterning the first photoresist to leave the first photoresist above the electrode pad and to provide an exposed portion in a portion of the electrode pad;

(6) forming an electrode film above the entire surface on the insulating film, the projecting photoresist and the exposed portion of the electrode pad by a sputtering;

(7) forming a second photoresist above the entire surface on the electrode film;

(8) patterning the second photoresist to leave the second photoresist in a corresponding position above the electrode pad; and (9) forming a bump electrode film connecting to the exposed position of the electrode pad above the projecting photoresist by etching the electrode film using the patterned second photoresist as a mask.

In step (5) of forming the projecting photoresist, the projecting photoresist may be provided above the substantially entire surface on the electrode pad and an opening portion may be formed for providing the exposed portion in a substantially central portion of the electrode pad.

Alternatively, the projecting photoresist is formed offset in some degree toward one side above the electrode pad to provide the exposed portion of the electrode pad near an edge of the opening portion of the insulating film.

Also in this case, in the step of forming the projecting photoresist, baking is performed at a temperature of approximately 350° C. for approximately 30 minutes in a nitrogen atmosphere after patterning the first photoresist.

The above and other objects, features and advantages of the invention will be apparent from the following detailed description which is to be read in conjunction with the accompanying drawings.

DETAILED DESCRIPTION OF THE PREFERRED EMBODIMENTS

Figure 1:
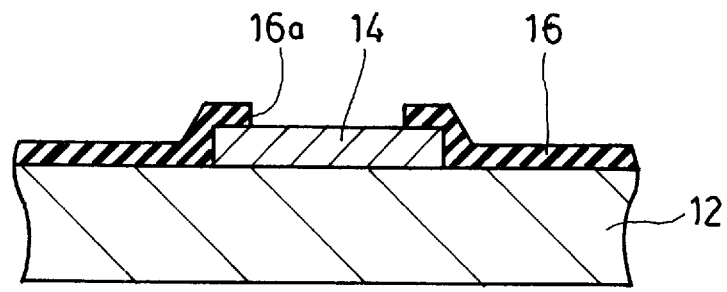
FIG. 1 to FIG. 5 are sectional views showing a semiconductor device in respective steps for describing a first embodiment of the semiconductor device and a method of fabricating the same according to the present invention.

The preferred embodiments of the present invention will be hereinafter described using the drawings.
First Embodiment: FIG. 1 to FIG. 5

FIG. 1 to FIG. 5 are sectional views showing a semiconductor device in respective steps for describing the semiconductor device and a method of fabricating the same according to the present invention. In these figures, the portions identical to those shown in FIG. 17 to FIG. 20 are designated with the same reference numerals and symbols.

First, the configuration of the semiconductor device of a first embodiment according to the present invention will be described with reference to FIG. 5.

Figure 20:
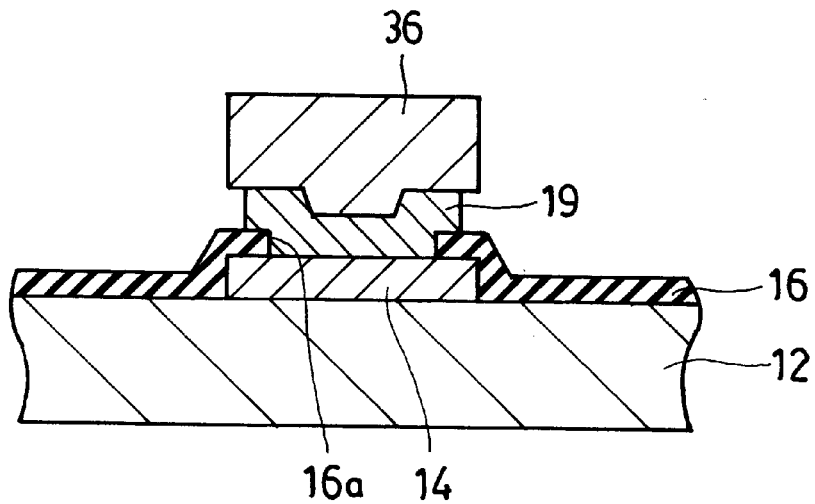
Figure 21:
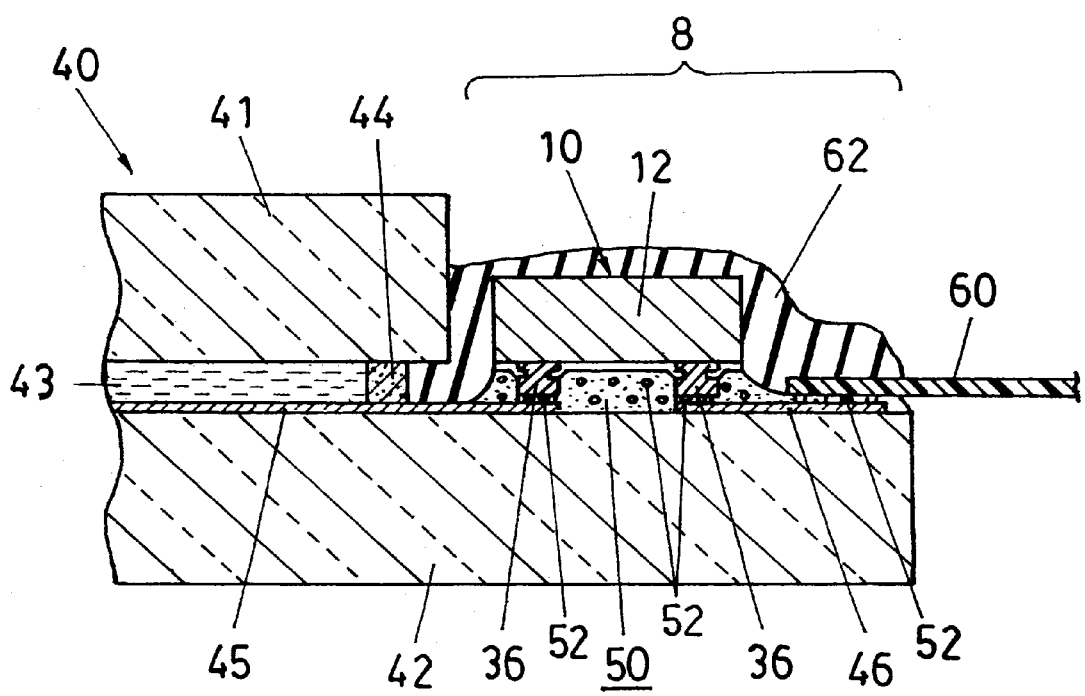
FIG. 21 is a sectional view showing an example of mounting the semiconductor device having the bump on a circuit board.

Similarly to the conventional semiconductor device shown in FIG. 20 the semiconductor device is provided with, on a semiconductor substrate 12 having an integrated circuit and multiple electrode pads 14 for connecting the integrated circuit to an external circuit, an insulating film 16 made of an inorganic material having opening portions 16a each formed to cover the edge of each electrode pad 14 and to expose the inside portion thereof.

A projecting photoresist 20 is provided to extend over the electrode pad 14 and the periphery of the opening portion 16a. In the projecting photoresist 20, an opening portion 20a is formed so as to leave an exposed portion 14a not covered in substantially the central portion of the electrode pad 14.

Additionally, a bump electrode film 23 is provided to cover the entire surface of the projecting photoresist 20 and the exposed portion 14a of the electrode pad 14.

This semiconductor device is provided with the projecting photoresist 20 having the opening portion 20a formed therein which is a hole or groove to leave the exposed portion 14a exposed in the substantially central portion on the electrode pad 14. The sequential bump electrode film 23 is formed to cover the surface of the projecting photoresist 20 and to connect to the exposed portion 14a of the electrode pad 14. Thus, an electrode corresponding to the lower electrode 19 and the bump 36 in the conventional semiconductor device shown in FIG. 20 is formed.

Next, the method of fabricating the semiconductor device shown in FIG. 5 will be described with reference to FIG. 1 to FIG. 5.

As shown in FIG. 1, the insulating film 16 is formed an the entire surface of the semiconductor substrate 12 having multiple elements (not shown) constituting an integrated circuit formed therein and provided with multiple electrode pads 14 made of aluminum. The opening portion 16a is formed so as to except the edge of the electrode pad 14 and to expose the inside portion thereof with the photoetching technique.

The insulating film 16 is obtained by forming a silicon nitride film with a plasma chemical vapor deposition (plasma CVD) process and has a thickness of approximately 1 $\mu$m.

Other than silicon nitride, an inorganic film formed of silicon dioxide, tantalum oxide, or aluminum oxide and so on may be formed for the insulating film 16. Additionally, for a method of forming the insulating film 16, the sputtering may be used other than the plasma CVD process.

Although the step for forming the opening portion 16a in the insulating film 16 with the photoetching technique is similar to that of the prior art, a more detailed description will be provided in the following.

First, a photoresist, not shown, is formed on the entire surface of the insulating film 16. The photoresist is exposed using a photomask and then subjected to a development treatment, thereby patterning the photoresist to form the opening portion on the electrode pad 14.

Thereafter, the photoresist thus patterned is used as an etching mask to etch the insulating film 16 with a wet or dry etching to form the opening portion 16a.

Figure 2:
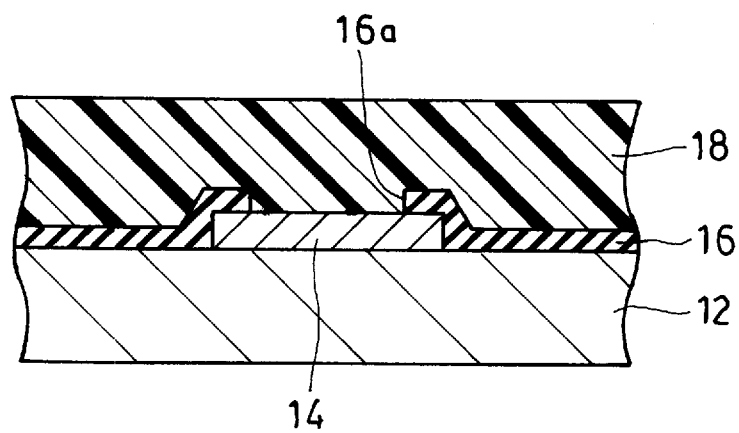

Next, as shown in FIG. 2, the photoresist 18 is formed on the entire surface of the insulating film 16 in a thickness of approximately 4 $\mu$m to 6 $\mu$m with the spin coating.

Figure 3:
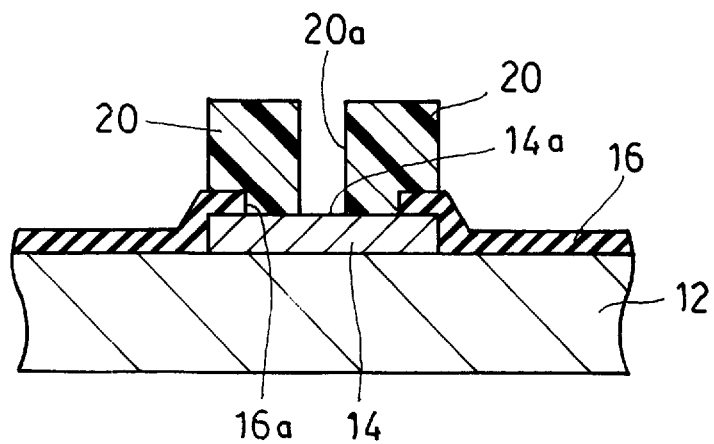

Thereafter, the photoresist 18 is patterned by performing the exposure treatment using a photomask and development treatment. Additionally, baking is performed in a nitrogen atmosphere at a temperature of approximately 350° C. for approximately 30 minutes to form the projecting photoresist 20 as shown in FIG. 3. The projecting photoresist 20 has the same shape in its plan as that of the electrode pad 14 and is provided with the opening portion 20a which is a hole or groove to leave the exposed portion 14a not covered in the substantially central portion of the electrode pad 14.

The surface of the projecting photoresist 20 is subjected to light etching by introducing oxygen gas including argon gas in a chamber of a dry ion etching apparatus at the flow rate of 30 cc per minute, maintaining the pressure at 5 Pa (pascal), and introducing RF power at 400 W for approximately 5 minutes.

Figure 4:
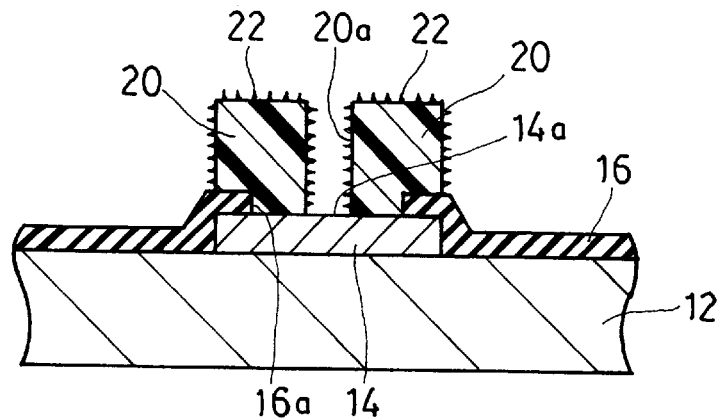

The light etching causes the surface of the projecting photoresist 20 to be etched. As a result, the surface is roughened as shown in FIG. 4 to form a plasma treatment layer 22 whose surface has a very fine roughness (shown in an enlarged projecting shape for easy understanding in FIG. 4).

At this point, the surface of the insulating film 16 is not changed in its shape since it is an inorganic film. Thus, the microscopic roughness is selectively formed only on the surface of the projecting photoresist 20.

The plasma treatment layer 22 is formed for selectively performing electroless plating only on the surface of the projecting photoresist 20.

Specifically, by forming the plasma treatment layer 22, a selective plating layer applied to the projecting photoresist 20 can be effectively formed with favorable adhesion characteristics.

The treatment for roughening the surface of the projecting photoresist 20 in this way may be performed not only with the above-described dry etching but also with the wet etching using a heated mixture of sulfuric acid and hydrogen peroxide, for example.

Figure 5:
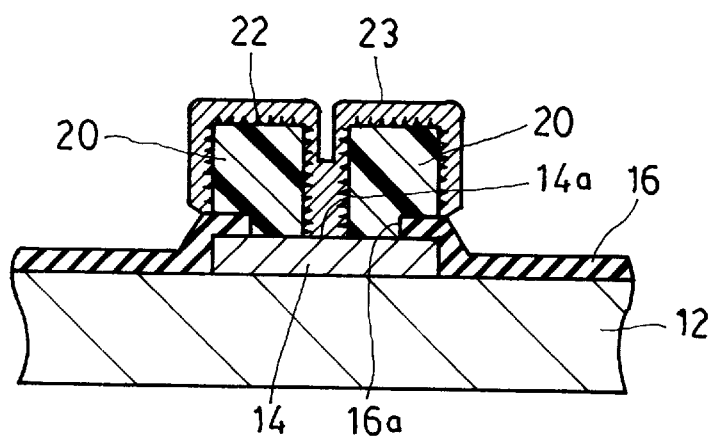

After forming the plasma treatment layer 22, the bump electrode film 23 as shown in FIG. 5 is formed by sequentially forming films of nickel in a thickness of 0.2 μm and gold at 0.5 μm with the electroless plating. At this point, only the surface of the projecting photoresist 20 that has been formed with the plasma treatment layer 22 is selectively subjected to the electroless plating to thereby form the bump electrode film 23.

The bump electrode film 23 is also formed on the inner surface of the opening portion 20a of the projecting photoresist 20 to cover the exposed portion 14a of the electrode pad 14 as shown in FIG. 5, causing the bump electrode film 23 and the electrode pad 14 to be electrically connected.

Thereafter, the semiconductor substrate 12 is cut into single pieces of a semiconductor chip in the dicing step to obtain a plurality of semiconductor devices.

The projecting photoresist 20 and the bump electrode film 23 in the semiconductor device are substituted for the lower electrode 19 and the bump 36 of the conventional semiconductor device shown in FIG. 20.

According to the semiconductor device and the method of fabricating the same of the first embodiment, since the height of the bump electrode film 23 can be optionally set depending on the thickness of the projecting photoresist 20, the need for forming a bump in a thick film as is conventional can be eliminated to reduce substantially the time for plating. Also, the common electrode film for the electroplating is not required so as to enable a great reduction in the number of fabricating steps. Thus, abnormal plating growth is eliminated to achieve an increased yield. Therefore, a semiconductor device having bumps formed at a finer pitch can be simply fabricated at a low cost.

Second Embodiment: FIG. 6 to FIG. 9

Next, a second embodiment of the semiconductor device and a method of fabricating the same according to the present invention will be hereinafter described with reference to FIG. 6 to FIG. 9. In these figures, portion. identical to those in FIG. 1 to FIG. 5 are designated with the same reference numerals and symbols and the description thereof is omitted or simplified.

First, the configuration of the semiconductor device of the second embodiment according to the present invention will be described with reference to FIG. 9.

The semiconductor device has a substantially similar configuration to that of the semiconductor device of the first embodiment shown in FIG. 5, except that the plasma treatment layer is not formed on the surface of the projecting photoresist 20 and a bump electrode film 25 connecting to an electrode pad 14 is provided only. on the upper surface of the projecting photoresist 20 and in an opening portion 20a. Also in this case, the projecting photoresist 20 and the bump electrode film 25 correspond to the lower electrode 19 and the bump 36 of the conventional semiconductor device shown in FIG. 20.

Next, the method of fabricating the semiconductor device will be described with reference to FIG. 6 to FIG. 9.

The steps of forming an insulating film 16 having opening portions 16a on a semiconductor substrate 12 provided with multiple electrode pads 14 and forming the projecting photoresist 20 (formed of a first photoresist) on each electrode pad 14 are the same as those of the fabricating method of the first embodiment described with reference to FIG. 1 to FIG. 3.

Figure 6:
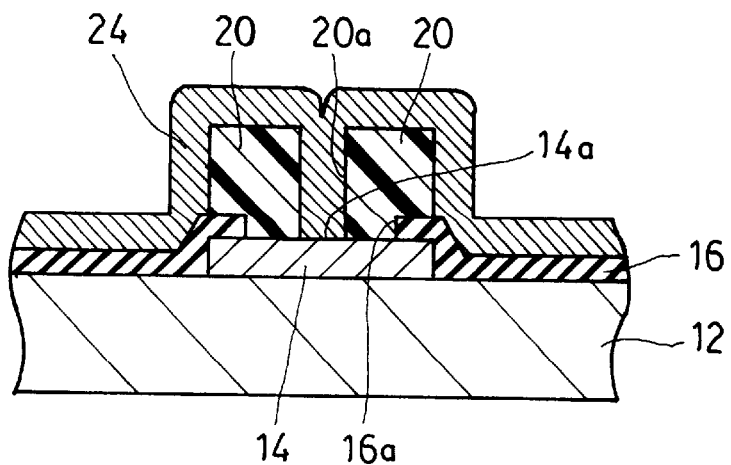
FIG. 6 to FIG. 9 are sectional views showing a semiconductor device in respective steps for describing a second embodiment of the semiconductor device and a method of fabricating the same according to the present invention.

From the state shown in FIG. 3, without performing the light etching of the surface of the projecting photoresist 20, the film forming is performed by sequentially forming titan (titanium) in a film thickness of 0.1 μm and gold at 0.2 μm on the entire surface of the insulating film 16 and the projecting photoresist 20 with the sputtering as shown in FIG. 6, thereby forming an electrode film 24 of a two-layer structure.

The electrode film 24 thus formed must be made of an electrode material selected to have a favorable electrical and mechanical connectivity with respect to the material (aluminum) forming the electrode pad 14, as well as having no diffusion between the electrode materials with stability.

The electrode film 24 may be the two-layer structure formed not only of titanium and gold as described above but also of other materials such as titanium and palladium, titanium and platinum, titanium-tungsten alloy and palladium, and titanium-tungsten alloy and gold, titanium-tungsten alloy and platinum, for example. Also, a three-layer structure of aluminum, titanium, and gold may be used.

Figure 7:
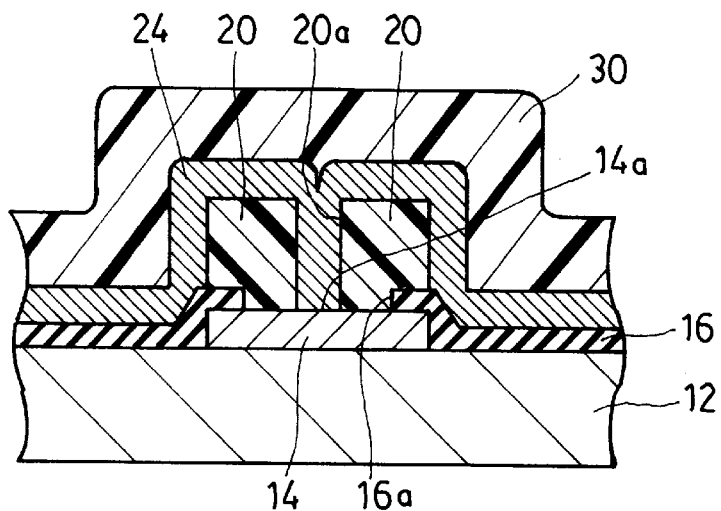

Thereafter, as shown in FIG. 7, a photoresist (second photoresist) 30 is formed on the entire surface of the electrode film 24 with the spinal coating. The exposure treatment using a photomask and the development treatment are performed to pattern the photoresist 30 so as to leave only the portion of the photoresist 30 corresponding to the upper surface of the electrode pad 14 above the electrode film 24 (see FIG. 8).

Next, the remaining photoresist 30 is used as a mask to etch the gold which is the upper layer of the electrode film 24 using an aqua regia. The aqua regia is an etchant obtained by mixing nitric acid ($HNO_3$) and hydrochloric acid (HCl) in the ratio of 1:3. Incidentally, this etching treatment is performed for an over-etching time approximately 30% longer than the just etching time.

Additionally, the titanium of the electrode film 24 serving as a barrier layer and contact layer is etched using Akutan 70 (product name) manufactured by Meltex Corp., which is an etchant for titanium. Incidentally, this etching treatment is also performed for an over-et-hing time approximately 30% longer than the just etching time.

Figure 8:
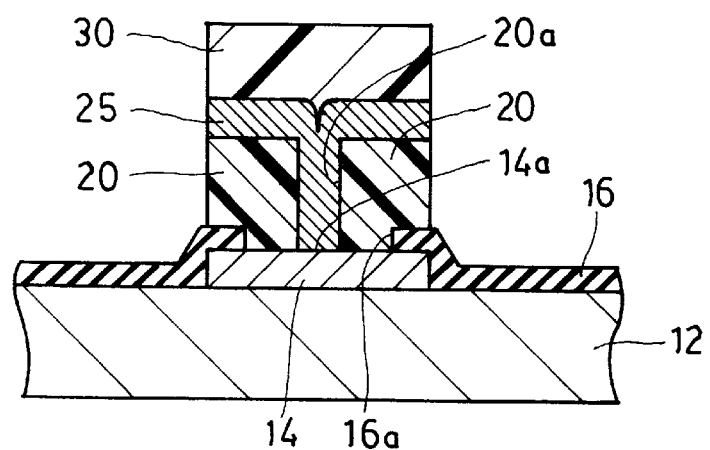

This etching treatment causes the electrode film 24 to be removed excepting the portion corresponding to the upper surface of the electrode pad 14. The remaining portion serves as the bump electrode film 25 as shown in FIG. 8.

Figure 9:
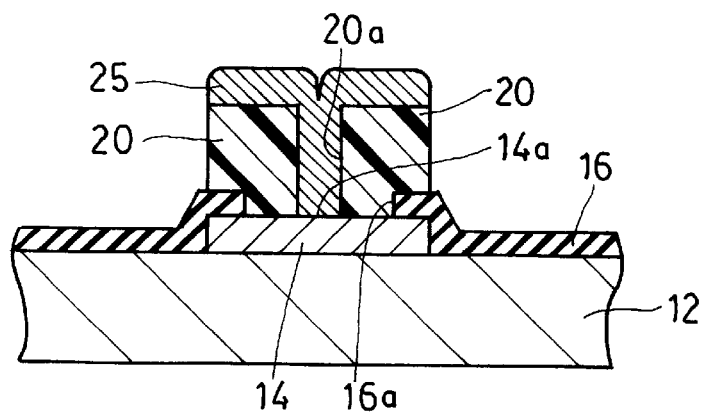
Figure 10:
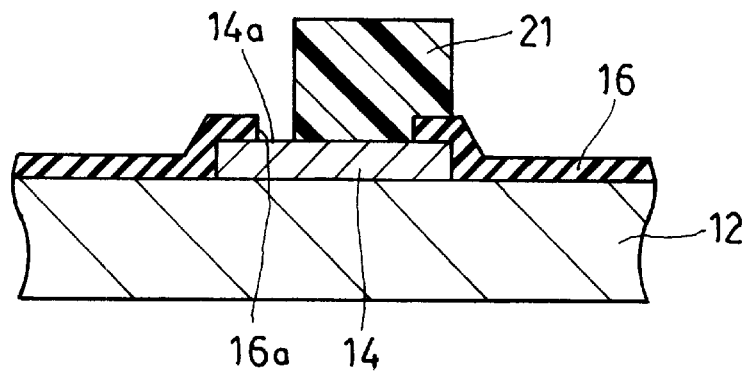
FIG. 10 to FIG. 14 are sectional views showing a semiconductor device in respective steps for describing a third embodiment of the semiconductor device and a method of fabricating the same according to the present invention.

Thereafter, the photoresist 30 on the bump electrode film 25 is removed using a wet stripper to obtain a state wherein the bump electrode film 25 connecting to the electrode pad 14 is provided only on the upper surface of the projecting photoresist 20 and in the opening portion 20a as shown in FIG. 9.

This semiconductor device 12 is then cut into single pieces of a semiconductor chip in the dicing step to thereby obtain a plurality of semiconductor devices.

According to the second embodiment, a physical vapor process such as the sputtering and the etching can provide the bump electrode film 25 only on the upper surface of the projecting photoresist 20, in the opening portion 20a and on the exposed portion 14a of the electrode pad 14. Therefore, the bump electrode film 25 can be formed without performing the electroplating as is conventional so that the fabricating steps are facilitated compared with the conventional case, achieving a reduction in time required for the fabricating steps and a reduction in cost.

Actions and effects of the second embodiment are similar to those of the above-mentioned first embodiment.

Third Embodiment: FIG. 10 to FIG. 14

Next, a third embodiment of the semiconductor device and a method of fabricating the same according to the present invention will be described with reference to FIG. 10 to FIG. 14. In these figures, portions corresponding to those in FIG. 1 to FIG. 9 are designated with the same reference numerals and symbols and the description thereof is omitted or simplified.

First, the configuration of the semiconductor device of the third embodiment according to the present invention will be described with reference to FIG. 14.

The semiconductor device has a configuration similar to that of the semiconductor device of the second embodiment shown in FIG. 9 except that a projecting photoresist 20 is not provided with an opening portion 20a and the projecting photoresist 20 is formed offset in some degree toward one side (right side in FIG. 14) above an electrode pad 14 such that an exposed portion 14a is provided in a portion of the electrode pad 14 near an opening portion 16a of an insulating film 16.

Also, a bump electrode film 26 is formed to extend over the upper surface of the projecting photoresist 20, the side surface of the projecting photoresist 20 on the side of the exposed portion 14a of the electrode pad 14, and over the exposed portion 14a and onto the insulating film 16 near the exposed portion 14a.

This semiconductor device can provide actions and effects similar to those of the above-mentioned second embodiment. Additionally, the projecting photoresist 20 need not be formed with an opening portion which is a hole or groove shape so as to allow finer bumps for the eliminated opening portion. Thus, multiple bumps corresponding to the wiring pattern with a higher density and finer pitch can be provided for the semiconductor device.

Next, the method of fabricating the semiconductor device will be described with reference to FIG. 10 to FIG. 14.

The steps of forming the insulating film 16 having the opening portions 16a on a semiconductor substrate 12 provided with multiple electrodes pads 14 and forming a photoresist 18 in a thickness of approximately 4 μm to 6 μm on the entire surface thereof are the same as those of the first and second embodiments described with reference to FIG. 1 and FIG. 2.

Thereafter, a photomask different from that of the first or second embodiment is used to perform the exposure and the development treatments, thereby patterning the photoresist 18. Additionally, baking is performed at a temperature of approximately 350° C. for approximately 30 minutes in a nitrogen atmosphere to form a projecting photoresist 21 shown in FIG. 10.

The projecting photoresist 21 is formed offset in some degree toward one side (right side in FIG. 10) above the electrode pad 14 so as to provide the exposed portion 14a at a portion of the electrode pad 14 near the opening portion 16a of the insulating film 16.

Figure 11:
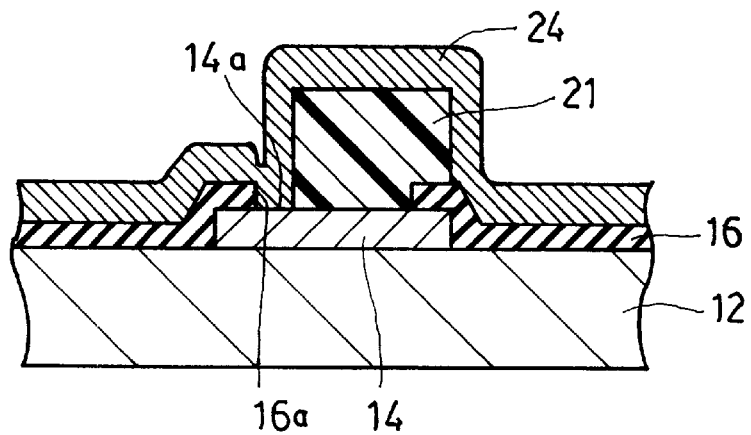

Similarly to the case of the second embodiment, an electrode film 24 is formed on the entire surface including the insulating film 16, the projecting photoresist 21, and the exposed portion 14a of the electrode pad 14 by the sputtering as shown in FIG. 11. The electrode film 24 has a two-layer structure of titanium and gold, for example, and is formed of an electrode material selected to have a favorable electrical and mechanical connectivity of the electrode film 24 formed to the electrode pad 14, as well as having no diffusion between the electrode materials with stability, which is similar to the case of the second embodiment.

Figure 12:
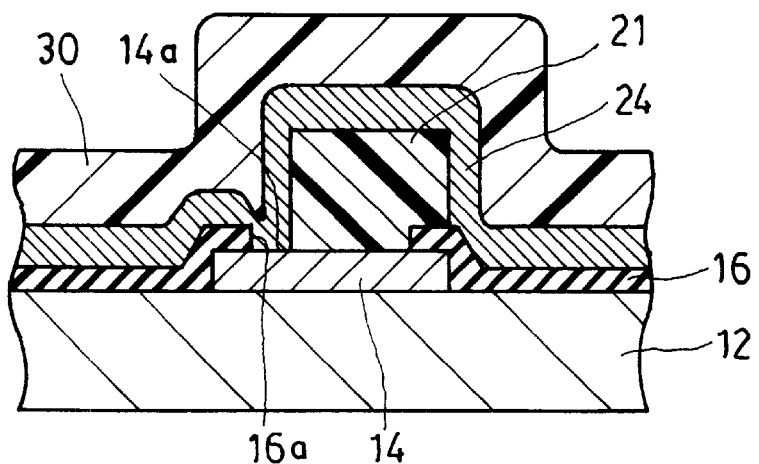

Thereafter, a photoresist 30 is formed on the entire surface of the electrode film 24 with the spin coating as shown in FIG. 12. Additionally, the exposure treatment using a required photomask and the development treatment are performed, thereby patterning the photoresist 30 so as to leave only the portion of the photoresist 30 corresponding to the upper surface of the electrode pad 14 above the electrode film 24 (see FIG. 13).

Figure 13:
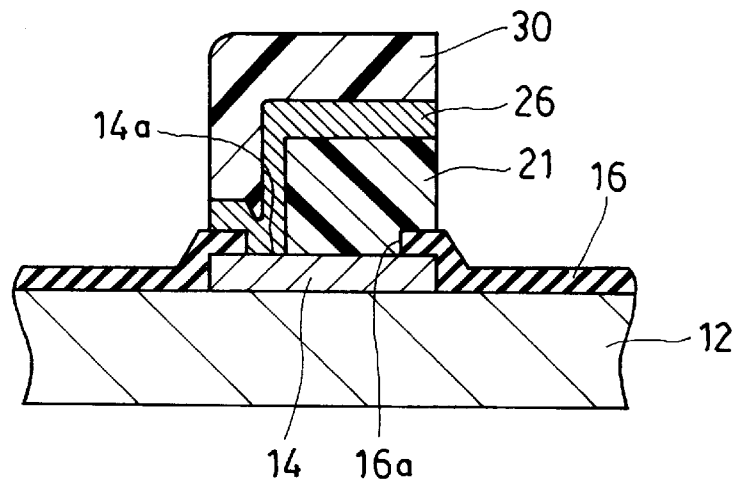

The remaining photoresist 30 is used as a mask to etch the gold which is the upper layer of the electrode film 24 similarly to the case of the second embodiment. Next, the titanium serving as a barrier layer and contact layer of the electrode film 24 is etched. Thus, the electrode film 24 excepting the portion masked by the photoresist 30 is removed and the remaining portion forms the projecting photoresist 26 as shown in FIG. 13.

Figure 14:
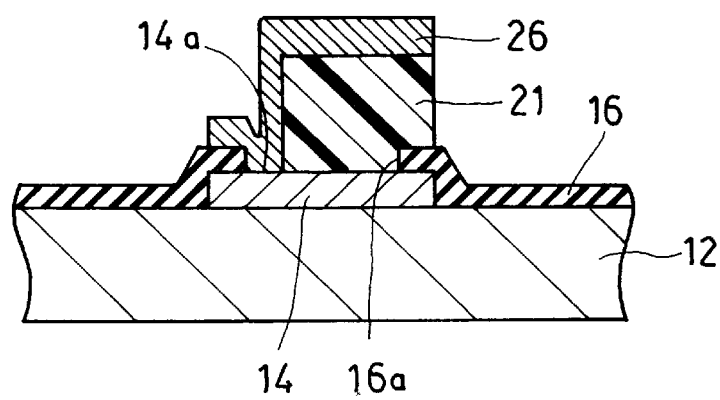

The photoresist 30 on the projecting photoresist 26 is then removed to obtain a state wherein the projecting photoresist 26 connecting to the electrode pad 14 is formed on the surface of the projecting photoresist 21 as shown in FIG. 14.

This semiconductor device 12 is cut into single pieces of a semiconductor chip in the dicing step to obtain a plurality of semiconductor devices.

Actions and effects of the semiconductor device are as described above. Incidentally, the exposed portion 14a of the electrode pad 14 not covered with the projecting photoresist 21 and forming the bump electrode film 26 may be provided anywhere near the opening portion of the insulating film 16.

Figure 15:
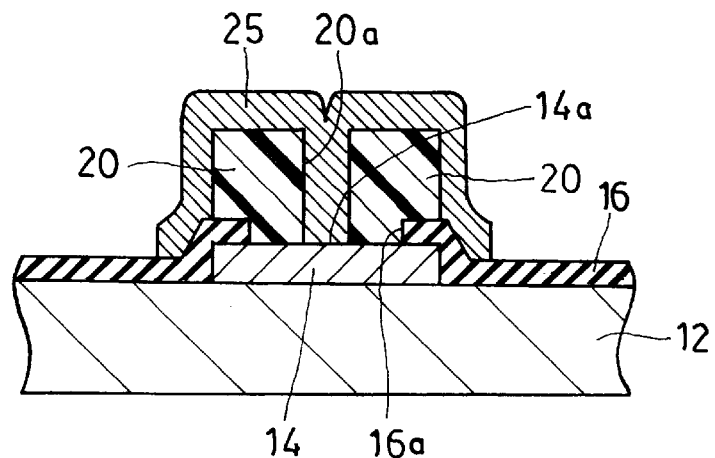
FIG. 15 is a sectional view showing a modification of the semiconductor device shown in FIG. 9.

Modifications: FIG. 15 an FIG. 16

Figure 16:
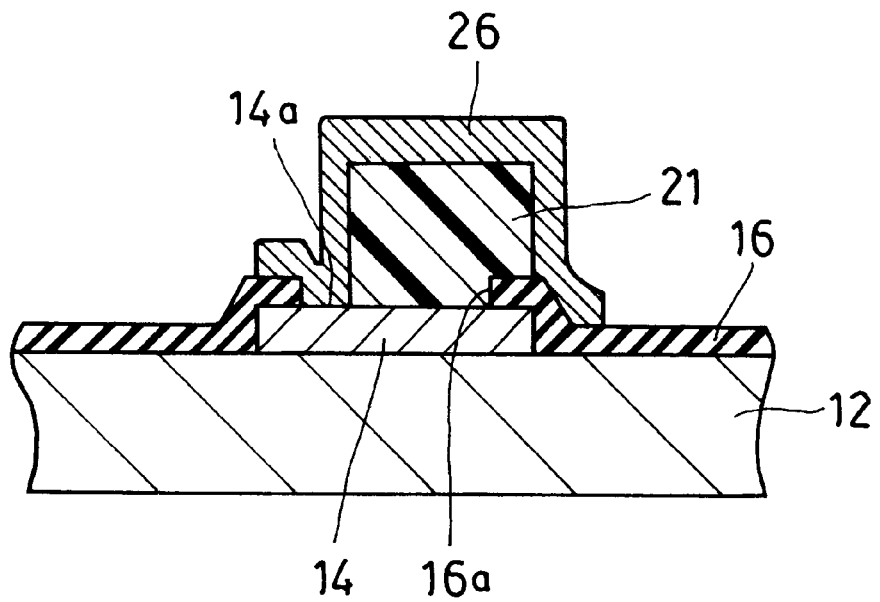
FIG. 16 is a sectional view showing a modification of the semiconductor device shown in FIG. 14.
Figure 17:
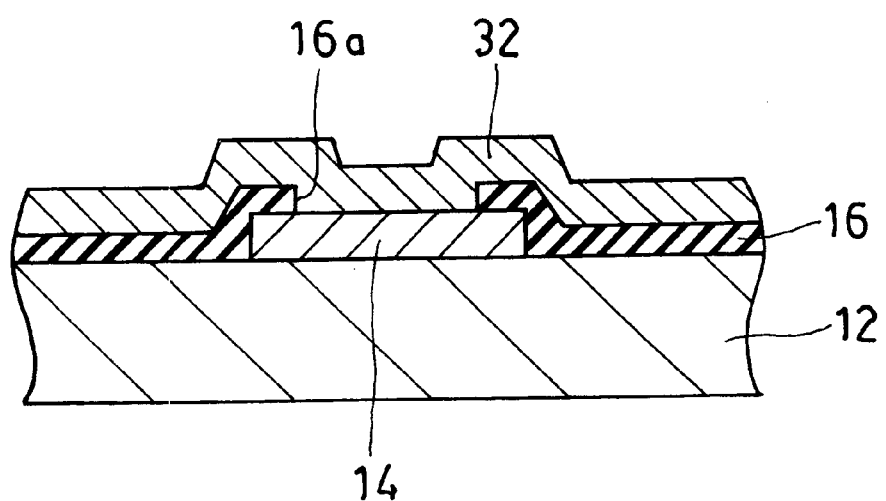
FIG. 17 to FIG. 20 are sectional views showing a semiconductor device in respective steps for describing the prior art semiconductor device having a bump and a method of fabricating the same.
Figure 18:
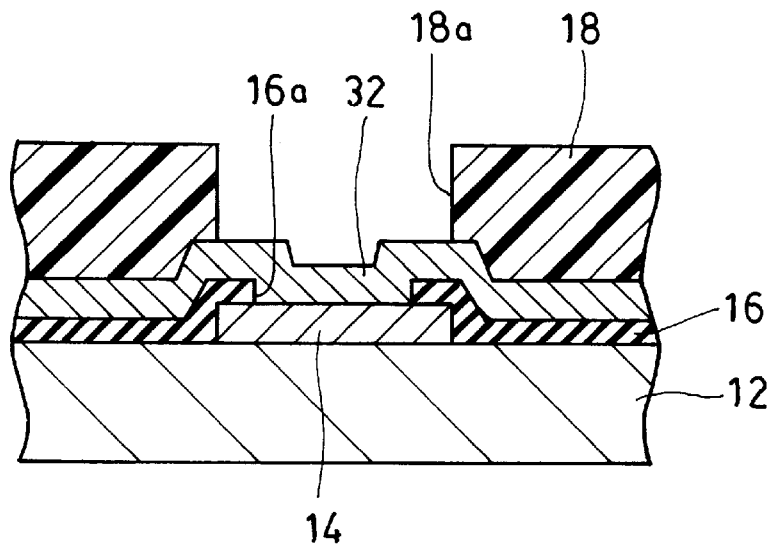
Figure 19:
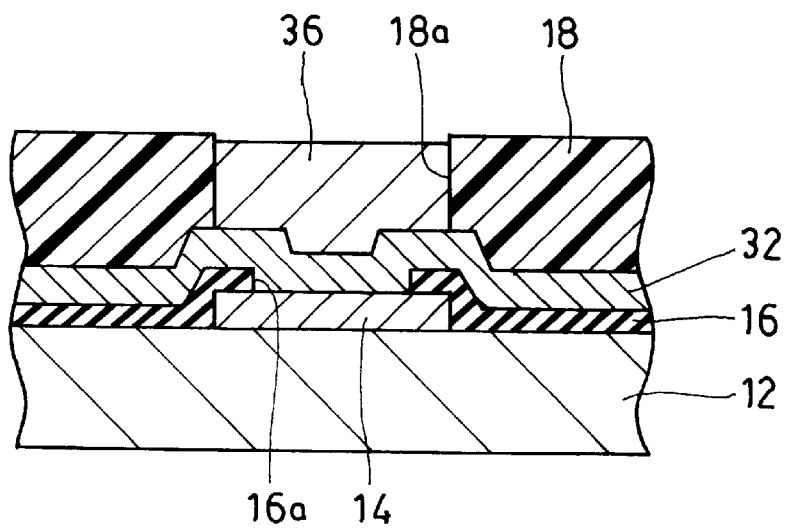

Next, modifications of the semiconductor device of the above-mentioned second and third embodiments are shown in FIG. 15 and FIG. 16.

FIG. 15 shows a modification of the semiconductor device of the second embodiment shown in FIG. 9 according to the present invention, in which an electrode film 24 is etched to be left also on side surfaces of a projecting photoresist 20 such that the electrode film 24 covers the entire surface of the projecting photoresist 20 to form a projecting photoresist 25.

On the other hand, FIG. 16 shows a modification of the semiconductor device of the third embodiment shown in FIG. 14 according to the present invention, in which an electrode film 24 is etched to be left also on the side surface of a projecting photoresist 21 opposite to an exposed portion 14a of an electrode pad 14 such that the electrode film 24 covers the entire surface of the projecting photoresist 21 to form a bump electrode film 26.

It is needless to say that both of them provide actions and effects similar to those of the first and second embodiments. In addition, the bump electrode film 25 or 26 is strongly attached to the projecting photoresist 20 or 21 so that the stripping thereof can be prevented.

In the semiconductor device shown in FIG. 14, the exposed portion 14a of the electrode pad 14 may be provided on the left and right sides near the edge of the insulating film 16 in the figure to cause the bump electrode film 26 to be connected to the electrode pad 14 on both sides of the projecting photoresist 21.

Effect of the Invention

As described above, in the semiconductor device and the method of fabricating the same according to the present invention, the projecting photoresist is provided on the electrode pad formed on the semiconductor substrate so as to leave the portion of the electrode pad exposed. The bump electrode film to be connected to the electrode pad is formed on the surface of the projecting photoresist with a selective electroless plating or a physical vapor process and etching, thereby obtaining the bump for mounting on the circuit board.

Therefore, the thick-film bump need not be formed with electroplating and the need of forming and etching the common electrode film is eliminated. Thus, the fabricating steps of the semiconductor device for surface mounting provided with the bumps can be simplified to increase the yield, thereby realizing a reduction in cost. Also, the semiconductor device provided with the bumps at a fine pitch can be fabricated simply and inexpensively.

Additionally, the fabrication of the conventional semiconductor device provided with the bumps requires the use of all of the expensive fabricating apparatuses including the electroplating apparatus, the sputtering apparatus and the etching apparatus. However, the method of fabricating the semiconductor device according to the present invention requires only the use of the electroless plating apparatus and the etching apparatus or the sputtering apparatus and the etching apparatus without using the electroplating apparatus, thereby enabling the expense for the fabricating apparatus to be greatly reduced. Therefore, the method of fabricating the semiconductor device according to the present invention is very advantageous in industrial production.

What is claimed is:

1. A semiconductor device comprising:

a semiconductor substrate provided with an integrated circuit and an electrode pad connecting the integrated circuit to an external circuit;

an insulating film disposed over said semiconductor substrate and having an opening portion covering an edge portion of the electrode pay and exposing a surface of the electrode pad; and a bump including a projecting photoresist and a bump electrode film, said projecting photoresist disposed over the surface of the electrode pad and over the opening portion of the insulating film, and having an opening exposing an exposed portion of the surface of the electrode pad, and said bump electrode film covering said projecting photoresist and connecting to the exposed portion of the electrode pad through the opening of said projecting photoresist, said bump electrode film having a thickness less than a thickness of said projecting photoresist.

2. The semiconductor device according to claim 1, wherein said projecting photoresist is disposed over the entire surface of the electrode pad and wherein the opening of said projecting photoresist is a hole or groove located at a substantially central portion of the surface of the electrode pad.

3. The semiconductor device according to claim 1, wherein said projecting photoresist is offset toward one side of the electrode pad to provide the opening of said projecting photoresist exposing the exposed portion of the electrode pad adjacent a part of the opening portion of said insulating film.

4. The semiconductor device according to claim 1, wherein said bump electrode film is a two-layer structure made of two kinds of metals including titanium.

5. The semiconductor device according to claim 1, wherein said bump electrode film is a three-layer structure made of three kinds of metals of aluminum, titanium and gold.

* * * * *